US 12,527,153 B2

United States Patent
Sun et al.

(10) Patent No.: US 12,527,153 B2
(45) Date of Patent: Jan. 13, 2026

(54) ORGANIC LIGHT-EMITTING DEVICE, DISPLAY DEVICE

(71) Applicant: BOE Technology Group Co., Ltd., Beijing (CN)

(72) Inventors: Haiyan Sun, Beijing (CN); Xiaojin Zhang, Beijing (CN); Dan Wang, Beijing (CN); Siqi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 326 days.

(21) Appl. No.: 18/268,610

(22) PCT Filed: Apr. 21, 2022

(86) PCT No.: PCT/CN2022/088278
§ 371 (c)(1),
(2) Date: Jun. 21, 2023

(87) PCT Pub. No.: WO2023/201651
PCT Pub. Date: Oct. 26, 2023

(65) Prior Publication Data
US 2024/0407187 A1    Dec. 5, 2024

(51) Int. Cl.
*H10K 50/12* (2023.01)
*H10K 101/00* (2023.01)
*H10K 101/30* (2023.01)

(52) U.S. Cl.
CPC ......... *H10K 50/12* (2023.02); *H10K 2101/30* (2023.02); *H10K 2101/90* (2023.02)

(58) Field of Classification Search
CPC ................................. H10K 2101/90
See application file for complete search history.

(56) References Cited

U.S. PATENT DOCUMENTS

2013/0075716 A1*  3/2013  Nishimura ............. H10K 50/11
                                                              257/40
2013/0313536 A1* 11/2013  Nishimura ............. C09K 11/06
                                                              257/40
(Continued)

FOREIGN PATENT DOCUMENTS

CN        101295767 A    10/2008
CN        102858911 A     1/2013
(Continued)

OTHER PUBLICATIONS

International Search Report issued Jan. 16, 2023 in International Patent Application No. PCT/CN2022/088278, 4 pages.
(Continued)

*Primary Examiner* — Evren Seven
(74) *Attorney, Agent, or Firm* — XSENSUS LLP

(57) ABSTRACT

The disclosure provides an organic light-emitting device and a display device, which belong to the field of display technology. The organic light-emitting device includes a light-emitting layer (600), including a first host material, a second host material, at least one auxiliary material, and at least one dopant material; the first host material and the second host material form a first composite transport material; the auxiliary material and the second host material form the second composite transport material; $S1(A)>S1(CH)>S1(C)$; $T1(A)>T1(CH)>T1(C)$; $S1(A)$ is the lowest singlet state energy of the host material, $S1(CH)$ is the lowest singlet state energy of the composite transport material, $S1(C)$ is the lowest singlet state energy of the dopant material; $T1(A)$ is the lowest triplet state energy of the host material, $T1(CH)$ is the lowest triplet state energy of the composite transport material, and $T1(C)$ is the lowest triplet state energy of the dopant material.

20 Claims, 4 Drawing Sheets

(56) References Cited

U.S. PATENT DOCUMENTS

| | | | |
|---|---|---|---|
| 2015/0188070 A1* | 7/2015 | Ogiwara | C09B 57/008 257/40 |
| 2015/0280158 A1* | 10/2015 | Ogiwara | H10K 50/131 257/40 |
| 2020/0083460 A1 | 3/2020 | Duan et al. | |
| 2021/0376252 A1* | 12/2021 | Sun | C07F 15/0086 |
| 2022/0006026 A1* | 1/2022 | Shiomi | H10K 85/6565 |
| 2022/0181561 A1* | 6/2022 | Fleetham | C07F 15/0086 |
| 2022/0416190 A1* | 12/2022 | Zhang | H10K 50/11 |

FOREIGN PATENT DOCUMENTS

| | | |
|---|---|---|
| CN | 102858911 B | 12/2014 |
| CN | 109311904 A | 2/2019 |
| CN | 109768176 A | 5/2019 |
| CN | 109994628 A | 7/2019 |
| CN | 110071221 A | 7/2019 |
| CN | 111416049 A | 7/2020 |
| CN | 111653679 A | 9/2020 |
| CN | 112151686 A | 12/2020 |
| CN | 112909197 A | 6/2021 |
| WO | 2021254051 A1 | 12/2021 |
| WO | 2022062702 A1 | 3/2022 |

OTHER PUBLICATIONS

Written Opinion issued Jan. 16, 2023 in International Patent Application No. PCT/CN2022/088278, 4 pages.

\* cited by examiner

ORGANIC LIGHT-EMITTING DEVICE, DISPLAY DEVICE

CROSS-REFERENCE TO RELATED APPLICATION

The present application is based on International Application No. PCT/CN2022/088278, filed on Apr. 21, 2022, and the entire contents thereof are incorporated herein by reference.

TECHNICAL FIELD

The present disclosure relates to the field of display technology, in particular to an organic light-emitting device and a display device.

BACKGROUND

Organic light-emitting device (OLED) is an active light-emitting device, which has the advantages of light emission, ultra-thin, wide viewing angle, high brightness, high contrast, low power consumption, high response speed, etc., and has gradually become an extremely promising next-generation display technology. An OLED includes an anode, a cathode, and an organic light-emitting layer arranged between the anode and the cathode. The principle of light emission is to inject holes and electrons into the light-emitting layer from the anode and the cathode respectively. When the electrons and holes meet in the light-emitting layer, electrons and holes recombine in the light-emitting layer to generate excitons, and these excitons emit light while changing from an excited state to a ground state.

Currently, OLEDs generally use phosphorescent materials as light-emitting materials.

The information disclosed in the above background portion is provided only for better understanding of the background of the present disclosure, and thus it may contain information that does not form the prior art known by those ordinary skilled in the art.

SUMMARY

The present disclosure is to provide an organic light-emitting device and a display device.

Example of the present disclosure adopts the following technical solutions:

According to a first aspect of the present disclosure, there is provided an organic light-emitting device, including a light-emitting layer, the light-emitting layer including a first host material, a second host material, at least one auxiliary material, and at least one dopant material;
  wherein the first host material and the second host material form a first composite transport material; and the secondary material and the second host material form a second composite transport material;
  wherein the first host material, the second host material, the first composite transport material, the second composite transport material, and the dopant material satisfy,
  S1(A)>S1(CH)>S1(C); and
  T1(A)>T1(CH)>T1(C);
  wherein S1(A) is a lowest singlet state energy of the first host material or the second host material, and S1(CH) is a lowest singlet state energy of the first composite transport material or the second composite transport material, and S1(C) is a lowest singlet state energy of the dopant material; and
  wherein T1(A) is a lowest triplet state energy of the first host material or the second host material, T1(CH) is a lowest triplet state energy of the first composite transport material or the second composite transport material, and T1(C) is a lowest triplet state energy of the dopant material.

In an exemplary embodiment of the present disclosure, the first host material, the second host material, the first composite transport material, the second composite transport material and the auxiliary material satisfy,
  S1(A)>S1(CH1)>S1(CH2), S1(A)>S1(B)>S1(CH2); and
  T1(A)>T1(CH1)>T1(CH2), T1(A)>T1(B)>T1(CH2);
  wherein, S1(CH1) is a lowest singlet state energy of the first composite transport material; and S1(CH2) is a lowest singlet state energy of the second composite transport material;
  wherein S1(B) is a lowest singlet state energy of the auxiliary material; and T1(B) is a lowest triplet state energy of the auxiliary material; and
  wherein T1(CH1) is a lowest triplet state energy of the first composite transport material; and T1(CH2) is a lowest triplet state energy of the second composite transport material.

In an exemplary embodiment of the present disclosure, the first host material, the second host material and the auxiliary material satisfy,
  |HOMO(A2)−LUMO(A1)|≥3.5 eV, |HOMO(A1)−LUMO(A2))|≤3 eV, |HOMO(B)−LUMO(A2)|≥2.3 eV;
  wherein HOMO(A1) is a highest occupied molecular orbital HOMO energy level of the first host material, and LUMO(A1) is a lowest unoccupied molecular orbital LUMO energy level of the first host material;
  wherein HOMO (A2) is a highest occupied molecular orbital HOMO energy level of the second host material, and LUMO (A2) is a lowest unoccupied molecular orbital LUMO energy level of the second host material; and
  wherein HOMO (B) is a highest occupied molecular orbital HOMO energy level of the auxiliary material, and LUMO (B) is a lowest unoccupied molecular orbital LUMO energy level of the auxiliary material.

In an exemplary embodiment of the present disclosure, the first host material, the second host material and the auxiliary material satisfy,
  |HOMO(A1)|>|HOMO(B)|≥5.6 eV; and
  |LUMO(B)|>|LUMO(A2)|>1 eV.

In an exemplary embodiment of the present disclosure, the first host material and the auxiliary material are bole-type materials, and the second host material is an electron-type material; and
  a hole mobility of the first host material is higher than a hole mobility of the auxiliary material.

In an exemplary embodiment of the present disclosure, a difference between the hole mobility and the electron mobility of the auxiliary material is not more than two orders of magnitude.

In an exemplary embodiment of the present disclosure, the first composite transport material and the second composite transport material satisfy,
  $\Delta E_{ST}(CH) \le 0.3$ eV;
  wherein, $\Delta E_{ST}(CH)$ is an energy level difference between the lowest singlet state energy of the first composite transport material and the lowest triplet state energy of the first composite transport material, or is an energy level difference between lowest singlet state energy of the second composite transport material and the lowest triplet state energy of the second composite transport material.

In an exemplary embodiment of the present disclosure, the auxiliary material is a delayed fluorescence material, and the auxiliary material satisfies, $\Delta E_{ST}(B) \leq 0.3$ eV;

wherein, $\Delta E_{ST}(B)$ is an energy level difference between the lowest singlet state energy of the auxiliary material and the lowest triplet state energy of the auxiliary material.

In an exemplary embodiment of the present disclosure, an emission spectrum of the second composite transport material is overlapped with an absorption spectrum of the dopant material, and a ratio between an overlapped area and an area of the emission spectrum of the second composite transport material is a, wherein a≥30%; and an emission spectrum of the auxiliary material is overlapped with an absorption spectrum of the dopant material, and a ratio between an overlapped area and an area of the emission spectrum of the auxiliary material is b, wherein b≥30%.

In an exemplary embodiment of the present disclosure, the at least one auxiliary material includes a first auxiliary material and a second auxiliary material;

the second composite transport material includes a first sub-composite transport material and a second sub-composite transport material;

the first auxiliary material and the second host material form the first sub-composite transport material, the second auxiliary material and the second host material form the second sub-composite transport material; and the second auxiliary material and the second sub-composite transport material satisfy, S1(B2)>S1(CH22); and

T1(B2)>T1(CH22);

wherein, S1(B2) is a lowest singlet state energy of the second auxiliary material; and T1(B2) is a lowest triplet state energy of the second auxiliary material; and wherein S1(CH22) is a lowest singlet state energy of the second sub-composite transport material; and T1(CH22) is a lowest triplet state energy of the second sub-composite transport material.

In an exemplary embodiment of the present disclosure, the first composite transport material, the first auxiliary material, the second auxiliary material, the first sub-composite transport material and the second sub-composite transport material satisfy, S1(CH1)>S1(B2)>S1(B1)>S1(CH21)>S1(CH22), and

T1(CH1)>T1(B2)>T1(B1)>T1(CH21)>T1(CH22);

wherein, S1(CH1) is a lowest singlet state energy of the first composite transport material; and S1(CH2) is a lowest singlet state energy of the second composite transport material;

wherein S1(B1) is a lowest singlet state energy of the second auxiliary material; and T1(B1) is a lowest triplet state energy of the second auxiliary material; and wherein S1(CH21) is a lowest singlet state energy of the first sub-composite transport material; T1(CH21) is the lowest triplet state energy of the first sub-composite transport material.

In an exemplary embodiment of the present disclosure, the first auxiliary material and the second auxiliary material satisfy,

|HOMO(B2)|−|HOMO(B1)|≤0.5 eV;

wherein, HOMO (B1) is a highest occupied molecular orbital HOMO energy level of the first auxiliary material, and HOMO (B2) is a highest occupied molecular orbital HOMO energy level of the second auxiliary material.

In an exemplary embodiment of the present disclosure, the dopant material is selected from fluorescent materials containing boron and nitrogen.

In an exemplary embodiment of the present disclosure, the first host material is selected from a hole-type material containing one or more groups of a carbazole group, a spirofluorene group, a biphenyl group, and an acridine group.

In an exemplary embodiment of the present disclosure, the second host material is selected from an electron-type material containing one or more groups of a cyano group, a pyridine group, a pyrimidine group, a triazine group, and a phosphooxy group.

In an exemplary embodiment of the present disclosure, the auxiliary material is selected from a material containing an electron-donating group and an electron-withdrawing group, and the electron-donating group is selected from one or more of a carbazole group, a phenoxazine group, an acridine group, a fluorene group, a dibenzothiophene group, and a dibenzofuran group, and the electron-withdrawing group is selected from one or more of a cyano group, a triazine group, and a phosphooxy group.

In an exemplary embodiment of the present disclosure, the organic light-emitting device further includes a cathode and an anode, and the light-emitting layer is disposed between the anode and the cathode;

wherein the light-emitting layer includes a first light-emitting layer and a second light-emitting layer, and the second light-emitting layer is disposed on a side of the first light-emitting layer away from the anode;

the first light-emitting layer includes the first host material, and the second light-emitting layer includes the second host material;

at least one of the first light-emitting layer and the second light-emitting layer includes the auxiliary material; and at least one of the first light-emitting layer and the second light-emitting layer includes the dopant material.

In an exemplary embodiment of the present disclosure, the organic light-emitting device further includes a cathode and an anode, and the light-emitting layer is disposed between the anode and the cathode;

wherein the light-emitting layer includes a first light-emitting layer and a second light-emitting layer, and the second light-emitting layer is disposed on a side of the first light-emitting layer away from the anode;

the first light-emitting layer includes the first host material and the first auxiliary material, and the second light-emitting layer includes the second host material and the second auxiliary material; and at least one of the first light-emitting layer and the second light-emitting layer includes the dopant material.

According to a second aspect of the present disclosure, there is provided a display device including the organic light-emitting device according to the first aspect.

BRIEF DESCRIPTION OF THE DRAWINGS

The above and other features and advantages of the present disclosure will become more apparent by describing in detail example embodiments thereof with reference to the accompanying drawings.

DETAILED DESCRIPTION

Figure 1:
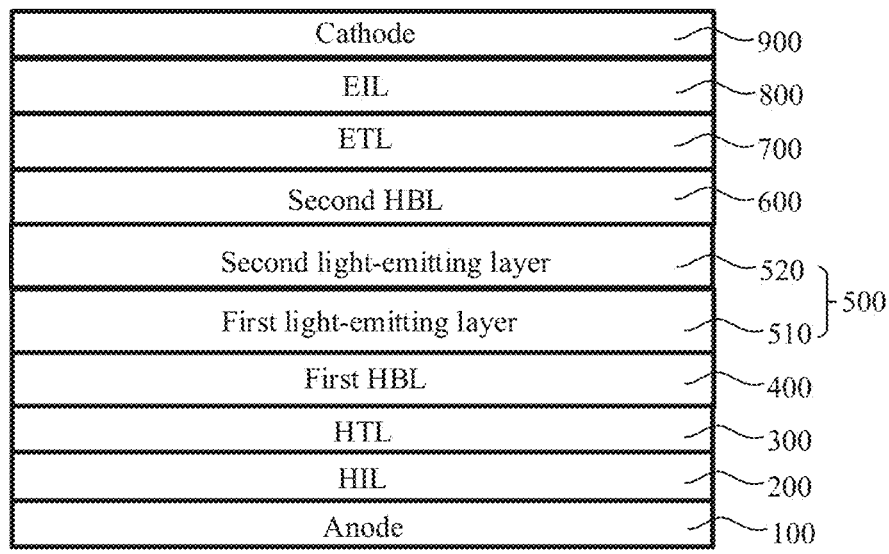
FIG. 1 is a schematic structural diagram of an organic light-emitting device in an exemplary embodiment of the present disclosure.

Example embodiments will now be described more fully with reference to the accompanying drawings. Example embodiments may, however, be embodied in many forms and should not be construed as limited to the examples set forth herein; rather, these embodiments are provided so that this disclosure will be thorough and complete, and will fully convey the concept of example embodiments to those skilled in the art. The described features, structures, or characteristics may be combined in any suitable manner in one or more embodiments. In the following description, numerous specific details are provided in order to give a thorough understanding of embodiments of the present disclosure.

In the drawings, the thicknesses of regions and layers may be exaggerated for clarity. The same reference numerals in the drawings denote the same or similar structures, and thus their detailed descriptions will be omitted.

The described features, structures, or characteristics may be combined in any suitable manner in one or more embodiments. In the following description, numerous specific details are provided in order to give a thorough understanding of embodiments of the present disclosure. However, one skilled in the art will appreciate that the technical solutions of the present disclosure may be practiced without one or more of the specific details, or that other methods, components, materials, etc. may be employed. In other instances, well-known structures, materials, or operations are not shown or described in detail to avoid obscuring the main technical idea of the present disclosure.

When a structure is "on" another structure, it may mean that a structure is integrally formed on another structure, or that a structure is "directly" placed on another structure, or that a structure is "indirectly" placed on another structure through another structure.

The terms "a", "an" and "the" are used to indicate the presence of one or more elements/components/etc.; and the terms "comprising" and "having" are used in an open inclusive sense and mean that there may be additional elements/components/etc., in addition to the listed elements/components/etc. the terms "first" and "second" etc. are used only as marks, not to limit the number of their objects.

TADF material is the third-generation organic light-emitting material developed after organic fluorescent materials and organic phosphorescent materials. It has achieved rapid development in recent years and is an organic light-emitting diode technology with good application potential. TADF materials have a small singlet-triplet state energy level difference (ΔEST), and triplet excitons can be transformed into singlet excitons to emit light through reverse intersystem crossing (RISC). Using singlet and triplet excitons formed under electrical excitation, the internal quantum efficiency of the device can reach 100%, the structure of the material is controllable, the property is stable, the price is cheap and no precious metals are needed, and it has a good application prospect. Although theoretically TADF materials can achieve 100% exciton utilization, the existing single-layer or double-layer light-emitting layer structures have problems such as serious non-radiative attenuation and triplet exciton annihilation.

Figure 2:
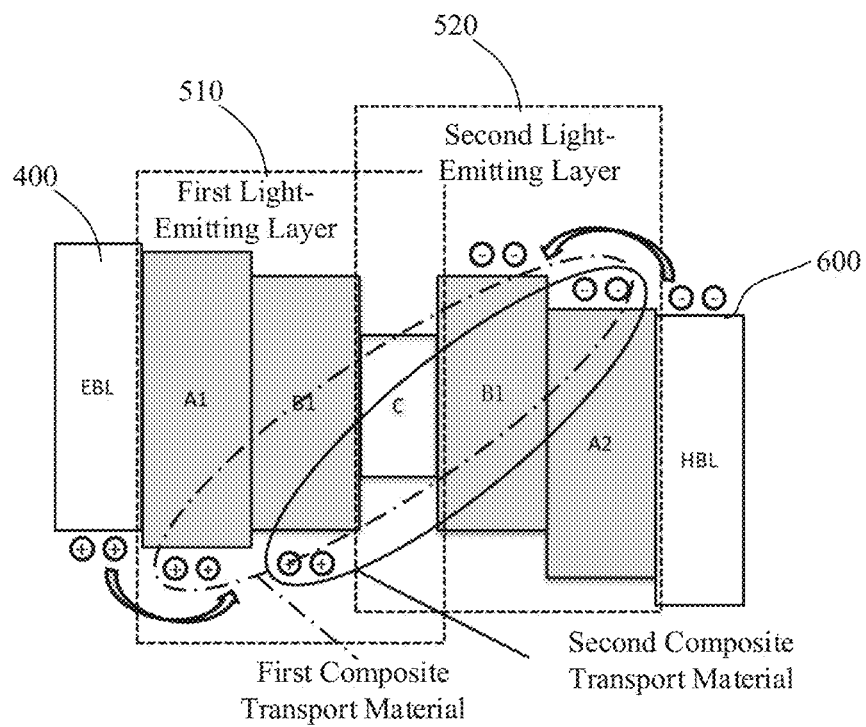
FIG. 2 is a schematic diagram of the structure of the light-emitting layer in an exemplary embodiment of the present disclosure.
Figure 3:
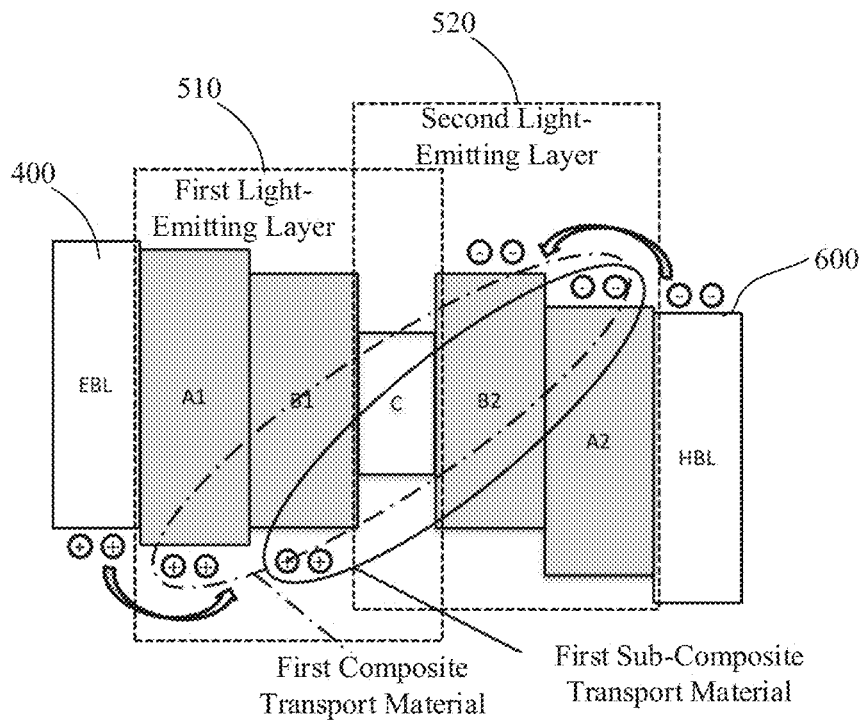
FIG. 3 is a schematic diagram of the structure of the light-emitting layer in another exemplary embodiment of the present disclosure.

As shown in FIG. 1 to FIG. 3, an organic light-emitting device is provided in an embodiment of the present disclosure, including a light-emitting layer 500. The light-emitting layer 500 includes a first host material, a second host material, at least one auxiliary material, and at least one dopant material. The first host material and the second host material form the first composite transport material; and the auxiliary material and the second host material form the second composite transport material. The first host material, the second host material, the first composite transport material, the second composite transport material and the dopant material satisfy, $S1(A) > S1(CH) > S1(C)$; and
$T1(A) > T1(CH) > T1(C)$;

wherein $S1(A)$ is the lowest singlet state energy of the first host material or the second host material, $S1(CH)$ is the lowest singlet state energy of the first composite transport material or the second composite transport material, $S1(C)$ is the lowest singlet state energy of the dopant material; $T1(A)$ is the lowest triplet state energy of the first host material or the second host material, $T1(CH)$ is the lowest triplet state energy of the first composite transport material or the second composite transport material state energy, and $T1(C)$ is the lowest triplet state energy of the dopant material.

In the organic light-emitting device provided by the present disclosure, the first host material and the second host material form a first composite transport material, the auxiliary material and the second host material form a second composite transport material, and both the first composite transport material and the second composite transport material help to disperse excitons, suppress the non-radiative transition of triplet excitons, reduce the degradation of materials caused by triplet quenching, improve the stability of materials, and perform Forster energy transfer to the dopant materials, perform radiative transition luminescence, effectively inhibit Dexter energy transfer, reduce energy loss, and improve device efficiency.

The components of the organic light-emitting device provided by the embodiments of the present disclosure will be described in detail below with reference to the accompanying drawings.

As shown in FIG. 1, the organic light-emitting device provided in the present disclosure includes an anode 100, a cathode 900 and a light-emitting layer 600, and the light-emitting layer 500 is disposed between the anode 100 and the cathode 900. The light-emitting layer 500 includes a first host material, a second host material, at least one auxiliary material and at least one dopant material. In some embodiments of the present disclosure, the organic light-emitting device further includes a hole injection layer (HIL) 200, a hole transport layer (HTL) 300, a first exciton blocking layer (EBL) 400, a second exciton blocking layer (HBL)) 600, electron transport layer (ETL) 700 and electron injection layer (EIL) 800. The hole injection layer 200 (HIL), the hole transport layer (HTL) 300 and the first exciton blocking layer (EBL) 400 are located between the anode 100 and the light-emitting layer 500, the second exciton blocking layer (HBL) 600, the electron transport layer (ETL) 700 and the electron injection layer (EIL) 800 are located between the light-emitting layer 500 and the cathode 900. The hole injection layer 200 is used to lower the barrier of hole injection from the anode, so that holes can be effectively injected from the anode 100 into the light-emitting layer 500, and the hole injection efficiency is improved. The hole transport layer 300 is used to achieve directional, orderly and controllable migration of injected holes. The first exciton blocking layer 400 is used to form a migration barrier for electrons or excitons, preventing electrons or excitons from migrating out of the light-emitting layer 500. The light-emitting layer 500 is used to recombine electrons and holes to form excitons to emit light. The second exciton blocking layer 600 is used to form a migration barrier for holes or excitons, preventing holes or excitons from migrating out of the light-emitting layer 500. The electron transport layer 700 is used to realize the orderly and controlled migration of injected electrons. The electron injection layer 800 is used to lower the potential barrier of injecting electrons from the cathode, so that the electrons can be effectively injected from the cathode 900 into the light-emitting layer 500.

In an exemplary embodiment, the anode 100 may employ a material having a high work function. For bottom-emitting OLEDs, the anode 100 can be made of a transparent oxide material, such as indium tin oxide (ITO) or indium zinc oxide (IZO), and the thickness of the anode can be about 80 nm to 200 nm. For top-emitting OLEDs, the anode 100 can adopt a composite structure of metal and transparent oxide, such as Ag/ITO or Ag/IZO, etc., the thickness of the metal layer in the anode 100 can be about 80 nm to 100 nm, and the thickness of the transparent oxide in the anode 100 may be about 5 nm to 20 nm, so that the average reflectance of the anode 100 in the visible light region is about 85% to 95%.

In an exemplary embodiment, for a top-emitting OLED, the cathode 900 may be formed by a metal material through an evaporation process, and the metal material may be magnesium (Mg), silver (Ag) or aluminum (Al), or an alloy material, Such as Mg:Ag alloy, Mg:Ag ratio is about 3:7 to 1:9, the thickness of the cathode 900 can be about 10 nm to 20 nm, so that the average transmittance of the cathode 900 at a wavelength of 530 nm is about 50% ~60%. For bottom emission OLED, the cathode 900 can be made of magnesium (Mg), silver (Ag), aluminum (Al) or Mg:Ag alloy, and the thickness of the cathode 900 can be greater than about 80 nm, so that the cathode 900 has good reflectivity.

In an exemplary embodiment, the hole injection layer 200 may use a single material, such as 4-isopropyl-4'-methyldiphenyliodonium tetrakis(pentafluorophenyl)borate and/or dipyrazino[2,3-f:2',3'-h]quinoxaline-2,3,6,7,10,11-hexacarbonitrile (HAT-CN), CuPc and other materials, or doped materials can be used, such as p-doped hole transport material, the p-doped ratio is about 0.5% to 10%, such as N,N'-Bis(naphthalen-1-vl)-N,N'-bis(phenyl)benzidine (NPB): 2,3,5,6-Tetrafluoro-7,7',8,8'-tetracyanoquinodimethane (F4-TCNQ), 4,4'-Cyclohexylidenebis[N,N-bis(4-methylphenyl)benzenamine] (TAPC): $MnO_3$, and the like. The thickness of the hole injection layer 200 may be about 5 nm to 20 nm.

In an exemplary embodiment, the hole transport layer 300 can be formed by a material with high hole mobility, such as carbazoles, methylfluorene, spirofluorene, dibenzothiophene, or furan, through an evaporation process. The thickness of the hole transport layer 300 may be about 100 nm to 140 nm.

In an exemplary embodiment, the first exciton blocking layer 400 may have a thickness of about 1 nm to 10 nm, and is configured to transfer holes, block electrons, and block excitons generated within the light-emitting layer.

In an exemplary embodiment, the second exciton blocking layer 600 has a thickness of about 2 nm to 10 nm and is configured to block holes as well as excitons generated in the light-emitting layer.

In an exemplary embodiment, the electron transport layer 700 can be prepared by blending thiophene, imidazole or azine derivatives with lithium quinolate, and the proportion of lithium quinolate is about 30% to 70%. The thickness of the electron transport layer 700 may be about 20 nm to 70 nm.

In an exemplary embodiment, the electron injection layer 800 can be formed by an evaporation process using materials such as lithium fluoride (LiF), lithium 8-hydroxyquinolate (LiQ), ytterbium (Yb) or calcium (Ca), and electron injection Layer 800 may have a thickness of approximately 0.5 nm to 2 nm.

Figure 4:
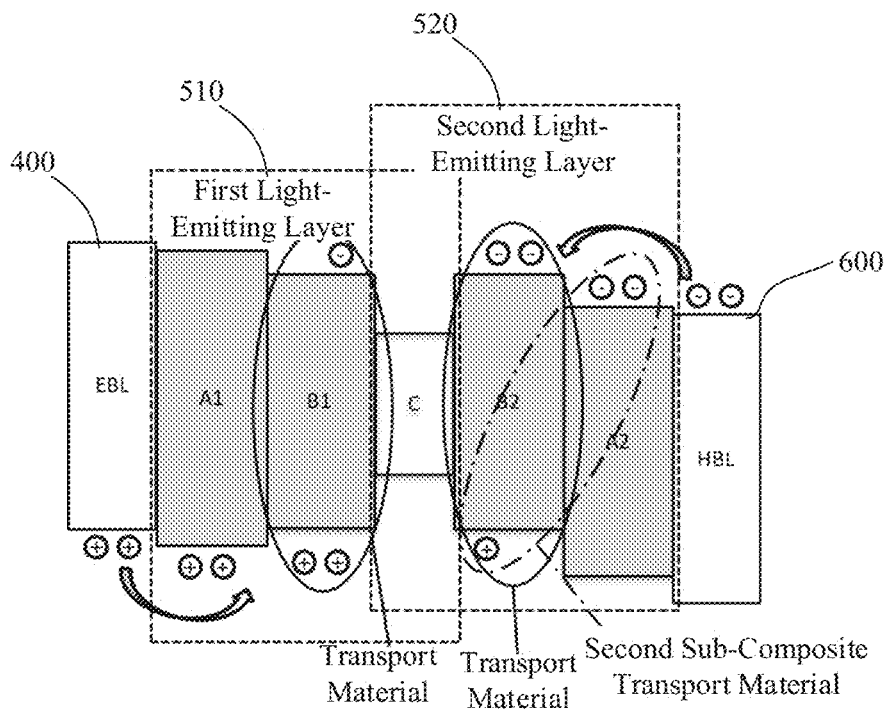
FIG. 4 is another structural schematic diagram of the light-emitting layer in another exemplary embodiment of the present disclosure.

As shown in FIGS. 2 to 4, the light-emitting layer 600 includes a first host material, a first host material, at least one auxiliary material and at least one dopant material. The first host material and the second host material form a first composite transport material, the auxiliary material and the second host material form a second composite transport material, and the first composite transport material, the second composite transport material and the auxiliary material can be used to disperse excitons or transfer exciton energy to the dopant material, so that the dopant material emits light.

The first host material, the second host material, the first composite transport material, the second composite transport material, and the dopant material satisfy, $S1(A)>S1(CH)>S1(C)$; and
$T1(A)>T1(CH)>T1(C)$;

wherein, $S1(A)$ is the lowest singlet state energy of the first host material or the second host material, $S1(CH)$ is the lowest singlet state energy of the first composite transport material or the second composite transport material, and $S1(C)$ is the lowest singlet state energy of the dopant material; and $T1(A)$ is the lowest triplet state energy of the first host material or the second host material, $T1(CH)$ is the lowest triplet state energy of the first composite transport material or the second composite transport material, and $T1(C)$ is the lowest triplet state energy of the dopant material.

In the present disclosure, the first composite transport material, the second composite transport material, and the auxiliary material all have opportunities to generate excitons, thereby dispersing the excitons, avoiding excessive concentration of excitons on a specific material, thereby reducing the quenching of triplet excitons due to excessive concentration of excitons at a certain position, which improves the luminous efficiency of the device. In addition, the lowest singlet state energy and lowest triplet state energy of the first composite transport material and the second composite transport material are lower than the lowest singlet state energy and lowest triplet state energy of the first host material and the second host material, and higher than the lowest singlet state energy and the lowest triplet state energy of the dopant material, the excitonic energy can be transferred to the dopant material through various channels to perform radiative transition luminescence and improve device efficiency.

In some embodiments of the present disclosure, the first host material, the second host material, the first composite transport material, the second composite transport material and the auxiliary material satisfy, S1(A)>S1(CH1)>S1(CH2), S1(A)>S1(B)>S1(CH2); and
T1(A)>T1(CH1)>T1(CH2), T1(A)>T1(B)>T1(CH2);
wherein, S1(CH1) is the lowest singlet state energy of the first composite transport material; and S1(CH2) is the lowest singlet state energy of the second composite transport material;
wherein S1(B) is the lowest singlet state energy of the auxiliary material; and T1(B) is the lowest triplet state energy of the auxiliary material; and
wherein T1(CH1) is the lowest triplet state energy of the first composite transport material; and T1(CH2) is the lowest triplet state energy of the second composite transport material.

In this embodiment, the exciton energy can be transferred to the dopant material through multi-level transfer or multiple pathways. For example, since S1(A)>S1(CH1)>S1 (CH2), S1(A)>S1(B)>S1(CH2); T1(A) T1(CH1)>T1(CH2), T1(A) T1(B)>T1(CH2); the excitonic energy can be transferred to the auxiliary material through the first composite transport material, and the auxiliary material can be used as a material to transfer the exciton energy to the second composite transport material, and then to the dopant material; or transferred to second composite transport material through the first composite transport material, and then to the dopant material; or directly to the dopant material via the first composite transport material. Multiple ways of transmission not only realize the separation of exciton recombination center and luminescent center, but also make the exciton energy in the whole device more dispersed, reduce triplet quenching and the degradation of materials caused by triplet quenching, and improve the stability of materials and device efficiency. In addition, the lowest singlet state energy or the lowest triplet state energy of the host material is higher, thereby confining the excitons in the composite transport material or auxiliary material, reducing the reflow of excitons and avoiding the decrease of luminous efficiency.

In some embodiments of the present disclosure, λpeak (CH1)<λpeak (CH2), λpeak (B)<λpeak (CH2);
wherein, λpeak (CH1) is the wavelength of the strongest emission peak of the first composite transport material, and λpeak (CH2) is the wavelength of the strongest emission peak of the second composite transport material; λpeak (B) is the strongest emission peak of the auxiliary material wavelength.

In some embodiments of the present disclosure, the first host material, the second host material and the auxiliary material satisfy,
|HOMO(A2)−LUMO(A1)|≥3.5 eV, |HOMO(A1)−LUMO(A2)|≤3 eV, |HOMO(B)−LUMO(A2)|≥2.3 eV;
wherein, HOMO(A1) is the highest occupied molecular orbital HOMO energy level of the first host material, LUMO(A1) is the lowest unoccupied molecular orbital LUMO energy level of the first host material; HOMO (A2) is the highest occupied molecular orbital HOMO energy level of the second host material, LUMO(A2) is the lowest unoccupied molecular orbital LUMO energy level of the second host material; HOMO (B) is the highest occupied molecular orbital HOMO energy level of the auxiliary material, LUMO (B) is the lowest unoccupied molecular orbital LUMO energy level of the auxiliary material.

In this embodiment, the materials satisfying the above energy level range help the first host material and the second host material to form the first composite transport material, and the auxiliary material and the second host material to form the second composite transport material.

Further, in some embodiments, |HOMO(A1)|>|HOMO (B)|≥5.6 eV; and
LUMO(B)|>|LUMO(A2)|≥1 eV.

In some embodiments of the present disclosure, the first host material and the auxiliary material are hole-type materials, and the second host material is an electron-type material. The hole mobility of the first host material is higher than that of the auxiliary material to ensure the concentration of holes in the light-emitting layer.

In some embodiments of the present disclosure, the difference between the hole mobility and the electron mobility of the auxiliary material does not exceed two orders of magnitude. When the hole mobility of the auxiliary material is greater than the electron mobility, the difference between the hole mobility and the electron mobility can be m, m×10$^1$, or m×10$^2$, wherein m can be any value greater than 0 and less than 10.

In some embodiments of the present disclosure, the first host material is selected from hole-type materials containing one or more of carbazole groups, spirofluorene groups, biphenyl groups, and acridine groups.

The carbazole group can be a carbazolyl group formed by losing one hydrogen atom from carbazole

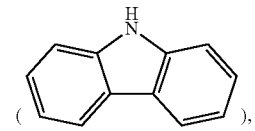 [SMILES: c1ccc2c(c1)[nH]c1ccccc12]

or a carbazolylene group formed by losing two hydrogen atoms, or a linking group formed by losing more hydrogen atoms, which is not limited by the present disclosure;

The spirofluorene group can be a spirofluorenyl group formed by losing one hydrogen atom from spirofluorene

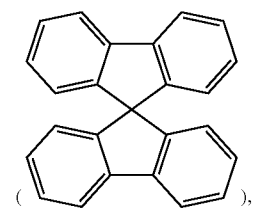 [SMILES: c1ccc2c(c1)-c1ccccc1C21c2ccccc2-c2ccccc21]

or a spirofluorenylene group formed by losing two hydrogen atoms, or a linking group formed by losing more hydrogen atoms, which is not limited by the present disclosure;

The biphenyl group can be a biphenylyl group formed by losing one hydrogen atom from biphenyl

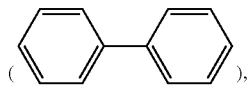, or a biphenylene group formed by losing two hydrogen atoms, or a linking group formed by losing more hydrogen atoms, which is not limited by the present disclosure;

The acridine group may be an acridinyl group formed by losing one hydrogen atom from acridine

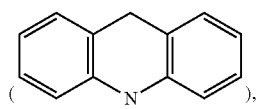, or an acridinylene group formed by losing two hydrogen atoms, or a linking group formed by losing more hydrogen atoms, which is not limited by the present disclosure.

In addition, in the present disclosure, the first host material may also be a hole-type material containing other groups, and the groups contained therein are not particularly limited in the present disclosure.

In some embodiments of the present disclosure, the first host material is selected from the group consisting of the following compounds:

A1-1

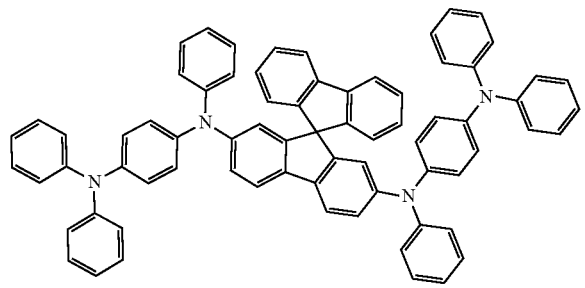

A1-2

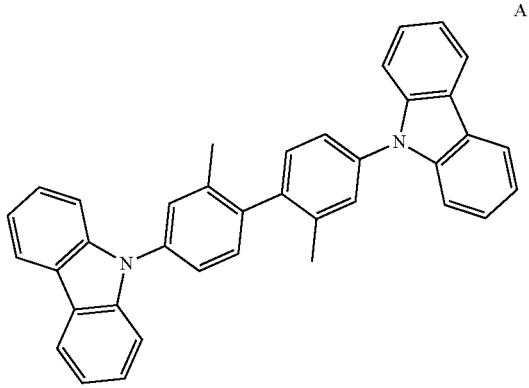

A1-3

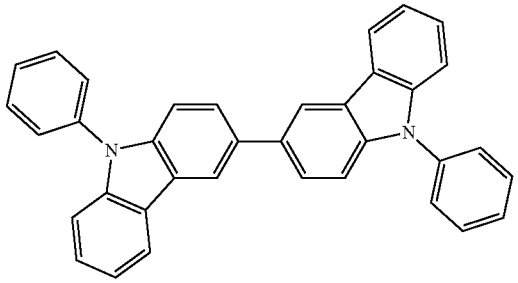

A1-4

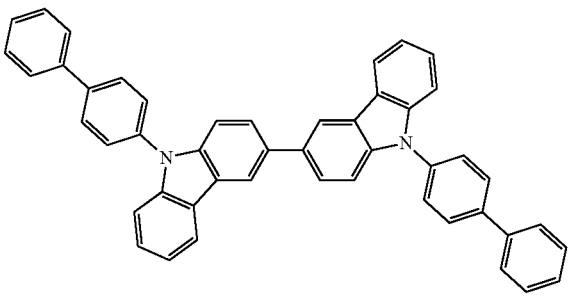

A1-5

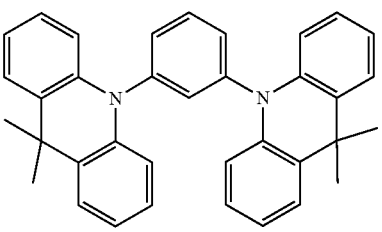

A1-6

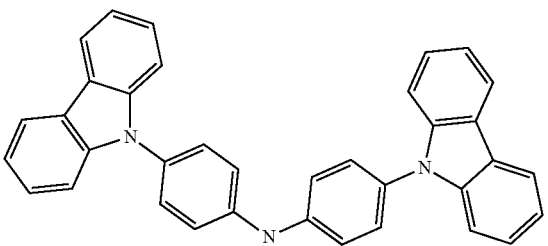

In some embodiments of the present disclosure, the second host material is selected from electron-type materials containing one or more of cyano groups, pyridine groups, pyrimidine groups, triazine groups, and phosphooxy groups.

In the present disclosure, the cyano group may be cyano (—CN);

The pyridine group can be a pyridyl group formed by losing one hydrogen atom from pyridine

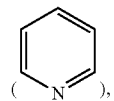

a pyridinylene group formed by losing two hydrogen atoms, or a linking group formed by losing more hydrogen atoms, which is not limited in this disclosure;

The pyrimidine groups can be a pyrimidinyl group formed by losing one hydrogen atom from pyrimidine

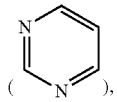

or a pyrimidinylene group formed by losing two hydrogen atoms, or a linking group formed by losing more hydrogen atoms, which is not limited in this disclosure;

The triazine group can be a triazinyl group formed by losing one hydrogen atom from triazine

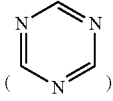

or a triazinylene group formed by losing two hydrogen atoms, or a linking group formed by losing more hydrogen atoms, which is not limited in this disclosure.

In addition, in the present disclosure, the second host material may also be an electron-type material containing other groups, and the groups contained therein are not particularly limited in the present disclosure.

In some embodiments of the present disclosure, the second host material is selected from the group consisting of the following structures:

A2-1

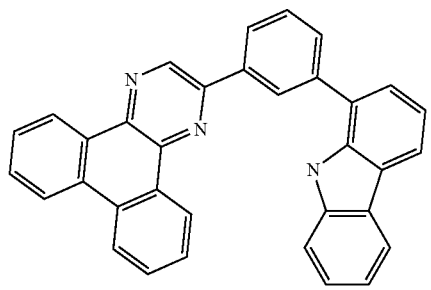

A2-2

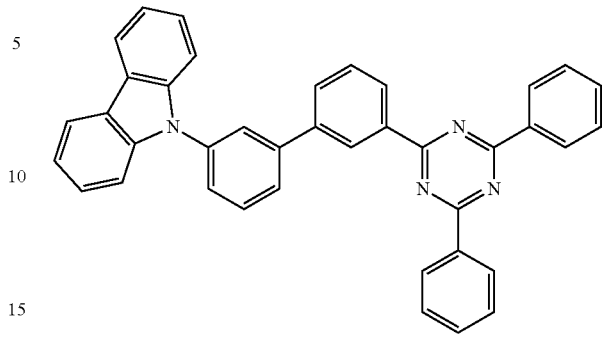

A2-3

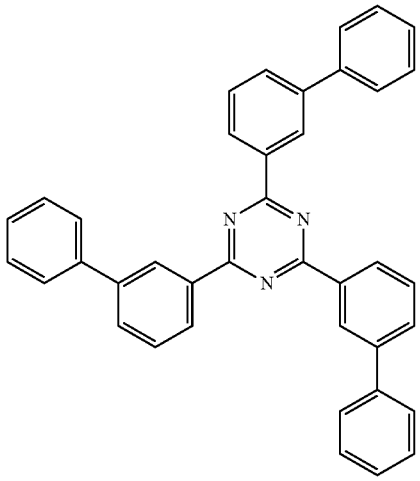

A2-4

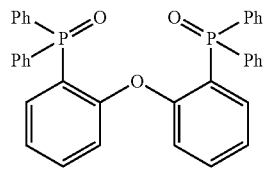

A2-5

A2-6

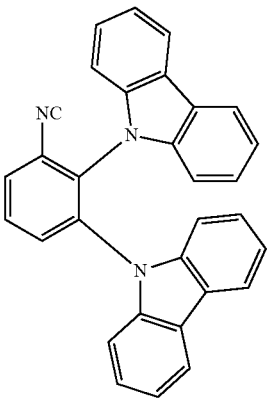

A2-7

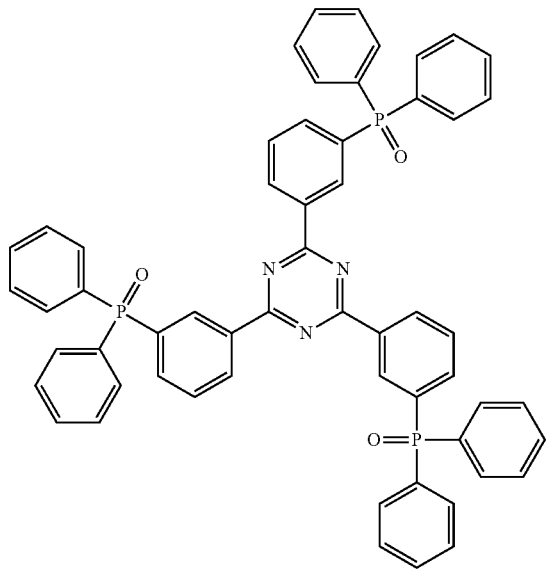

In some embodiments of the present disclosure, the first composite transport material and the second composite transport material satisfy, $\Delta E_{ST}(CH) \leq 0.3$ eV;

wherein $\Delta E_{ST}(CH)$ is the difference between the energy levels of the lowest singlet state energy of the first composite transport material and the lowest triplet state energy of the first composite transport material, or the difference between the energy levels of the lowest singlet state energy of the second composite transport material and the lowest triplet state energy of the second composite transport material.

Preferably, $\Delta E_{ST}(CH) \leq 0.2$ eV.

In some embodiments of the present disclosure, the auxiliary material is a delayed fluorescent material, and the auxiliary material satisfies, $\Delta E_{ST}(B) \leq 0.3$ eV;

wherein, $\Delta E_{ST}(B)$ is the energy level difference between the lowest singlet state energy of the auxiliary material and the lowest triplet state energy of the auxiliary material.

Preferably, $\Delta E_{ST}(B) \leq 0.15$ eV.

Figure 5:
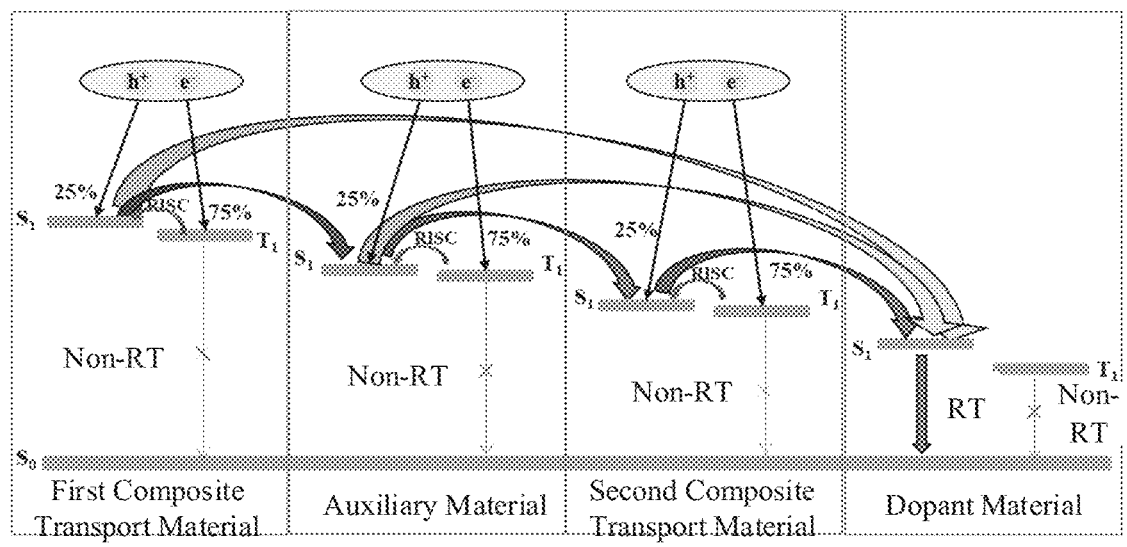
FIG. 5 is a schematic diagram of an energy transmission structure in an exemplary embodiment of the present disclosure.

As shown in FIG. 5, the excitons formed when the ground state is excited include two types, one is singlet excitons, and the other is triplet excitons. According to the rules of spin statistics, the ratio of generated singlet excitons and triplet excitons is 25%:75%. In the present disclosure, the energy level difference of the first composite transport material and the second composite transport material is small, and has a certain thermally activated delayed fluorescence (TADF) performance. Part of the triplet state energy of the first composite transport material and the second composite transport material can be returned to the singlet state energy through reverse intersystem crossing (RISC), and then transferred to the dopant material through Foster Resonance Energy Transfer (FET). Here, the first composite transport material can also be transferred to the first auxiliary material or the second composite transport material. The auxiliary material is a delayed fluorescence material, and its triplet state energy can also return to the singlet state energy through the reverse intersystem crossing process, and then transfer the energy to the second composite transport material or dopant material. In this way, the reverse intersystem crossing process can transfer almost all the energy through the singlet state to the next-level energy transport material or dopant material through the Fowler energy, and the dopant material can simultaneously utilize the singlet excitons and the excitons transitioning from the triplet state to their own singlet state to emit light. During the entire light emitting process, the Dexter energy transfer between triplet states is largely suppressed, which reduces energy loss and improves device performance.

In some embodiments of the present disclosure, the emission spectrum of the second composite transport material overlaps with the absorption spectrum of the dopant material, and the ratio of the overlapping area to the area of the emission spectrum of the second composite transport material is a, wherein a≥30%; preferably, a≥50%, such as 60% or 70% or the like.

The emission spectrum of the auxiliary material overlaps with the absorption spectrum of the dopant material, and the ratio of the overlapping area to the area of the emission spectrum of the auxiliary material is b, wherein b≥30%, preferably, b≥50%, such as 60% or 70% or the like.

In some embodiments of the present disclosure, the emission spectrum of the first composite transport material overlaps the absorption spectrum of the dopant material, and the ratio of the overlapping area to the area of the emission spectrum of the first composite transport material is c, wherein c≥20%.

Further, c<b<a, to prevent backflow of excitons and ensure the step-by-step transfer of energy.

The larger the overlap area between the emission spectrum of the second composite transport material or the auxiliary material and the absorption spectrum of the dopant material, the more sufficient the energy is transferred, the more fully the dopant material emits light. The energy quenching on the second composite transport material or the auxiliary material is reduced, the utilization rate of excitons is improved, the efficiency is improved, and the device life is improved. The present disclosure can improve light emitting efficiency of the device and improve the life of the device by configuring the overlapping area of the emission spectrum of the second composite transport material or auxiliary material and the absorption spectrum of the dopant material to be greater than or equal to 30%, preferably 50%, of the emission spectrum of the second composite transport material or auxiliary material.

As shown in FIG. 3 and FIG. 4, in some embodiments of the present disclosure, the light-emitting layer includes two auxiliary materials, that is, at least one auxiliary material includes a first auxiliary material and a second auxiliary material.

The second composite transport material includes a first sub-composite transport material and a second sub-composite transport material.

The first auxiliary material and the second host material form a first sub-composite transport material, and the second auxiliary material and the second host material form a second sub-composite transport material.

The second auxiliary material and the second sub-composite transport material satisfy,

S1(B2)>S1(CH22); T1(B2)>T1(CH22);

wherein, S1(B2) is the lowest singlet state energy of the second auxiliary material; and T1(B2) is the lowest triplet state energy of the second auxiliary material; and S1(CH22) is the lowest singlet state energy of the second sub-composite transport material; and T1(CH22) is the lowest triplet state energy of the second sub-composite transport material.

In this embodiment, the exciton energy can be transmitted to the dopant material through more channels, which can further disperse the exciton energy transfer to a certain extent and alleviate the degradation of the material.

In some embodiments of the present disclosure, the first composite transport material, the first auxiliary material, the second auxiliary material, the first sub-composite transport material and the second sub-composite transport material satisfy, S1(CH1)>S1(B2)>S1(B1)>S1(CH21)>S1(CH22); and T1(CH1)>T1(B2)>T1(B1)>T1(CH21)>T1(CH22);

wherein, S1 (CH1) is the lowest singlet state energy of the first composite transport material; and S1 (CH2) is the lowest singlet state energy of the second composite transport material;

S1(B1) is the lowest singlet state energy of the second auxiliary material; and T1(B1) is the lowest triplet state energy of the second auxiliary material; and S1(CH21) is the lowest singlet state energy of the first sub-composite transport material; and T1(CH21) is the lowest triplet state energy of the first sub-composite transport material.

In some embodiments of the present disclosure, λpeak (B2)<λpeak(CH22);

wherein, λpeak(B2) is the wavelength of the strongest emission peak of the second auxiliary material, and λpeak (CH22) is the wavelength of the strongest emission peak of the second sub-composite transport material.

In some embodiments of the present disclosure, the first auxiliary material and the second auxiliary material satisfy,

|HOMO(B2)|−|HOMO(B1)|≤0.5 eV; and preferably, |HOMO (B2)|−|HOMO(B1)|≤0.2 eV;

wherein, HOMO(B1) is the highest occupied molecular orbital HOMO energy level of the first auxiliary material, and HOMO (B2) is the highest occupied molecular orbital HOMO energy level of the second auxiliary material.

In some embodiments of the present disclosure, the auxiliary material is selected from materials containing electron-donating groups and electron-withdrawing groups, and the electron-donating groups are selected from one or more of carbazole groups, phenoxazine groups, acridine groups, fluorene groups, dibenzothiophene groups, and dibenzofuran groups, and the electron-withdrawing groups are selected from one or more of cyano groups, triazine groups, and phosphooxy groups.

In the present disclosure, the phenoxazine group is a phenoxazinyl group formed by losing one hydrogen atom from phenoxazine

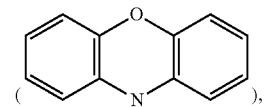

or a phenoxazinylene group formed by losing two hydrogen atoms, or a linking group formed by losing more hydrogen atoms, which is not limited in this disclosure.

In the present disclosure, the dibenzothiophene group is a dibenzothiophenyl group formed by losing one hydrogen atom from a dibenzothiophene

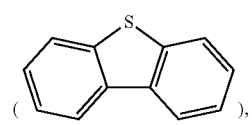 [SMILES: c1ccc2c(c1)sc1ccccc12]

or a dibenzothiophenylene group formed by losing two hydrogen atoms, or a linking group formed by losing more hydrogen atoms, which is not limited in this disclosure.

In the present disclosure, the dibenzofuran group is a dibenzofuryl group formed by losing one hydrogen atom from dibenzofuran

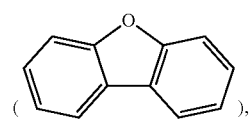 [SMILES: c1ccc2c(c1)oc1ccccc12]

or a dibenzofurylene group formed by losing two hydrogen atoms, or a linking group formed by losing more hydrogen atoms, which is not limited in this disclosure.

In some embodiments of the present disclosure, the auxiliary material is selected from the group consisting of the following structures:

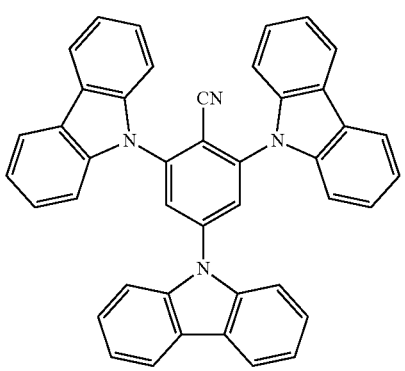

B-1

B-2
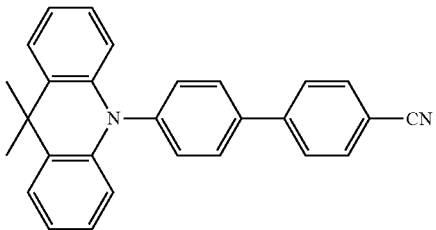

B-7
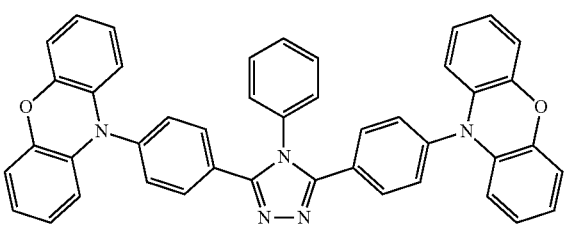

B-3
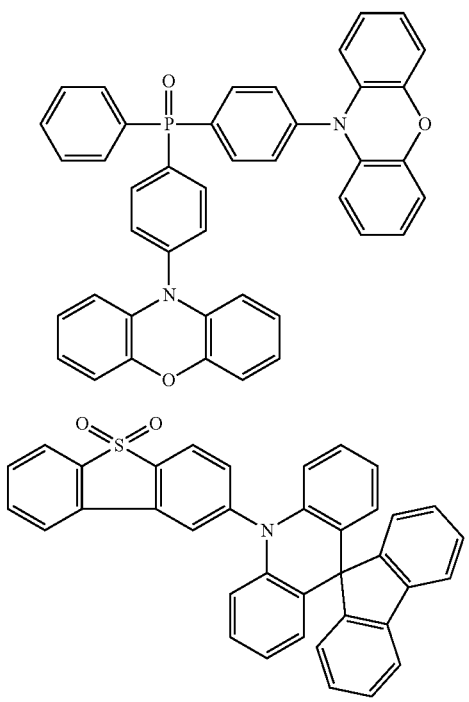

B-8

B-4
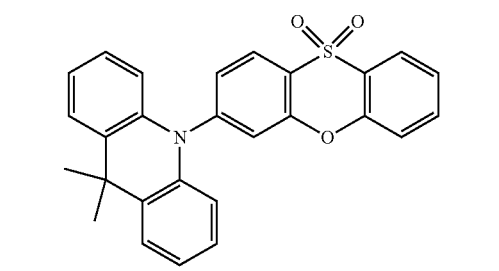

In some embodiments of the present disclosure, the light-emitting layer includes two kinds of dopant materials, that is, at least one dopant material includes a first dopant material and a second dopant material.

In some embodiments of the present disclosure, the dopant material is selected from fluorescent materials containing boron and nitrogen. The fluorescence quantum yield of the dopant material is PLQY>80%, and the doping ratio in the light-emitting layer is not more than 2%, preferably less than 1%. The doping ratio refers to the ratio of the dopant material to the sum of the host material, auxiliary material and dopant material.

Specifically, the dopant material contains at least one nitrogen atom, and the boron is tricoordinated or tetracoordinated.

B-5
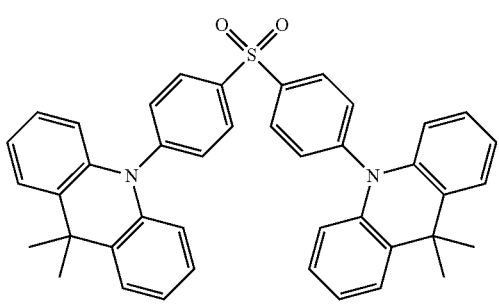

In some embodiments, the dopant material is selected from the group consisting of:

C-1
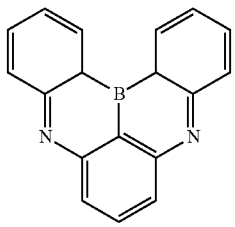

B-6
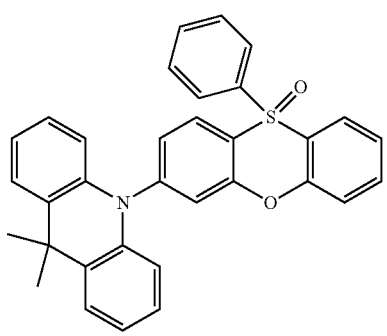

C-2
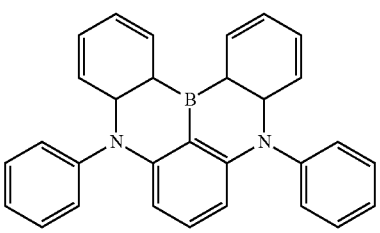

C-3

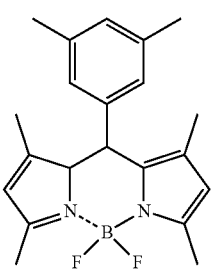

C-4

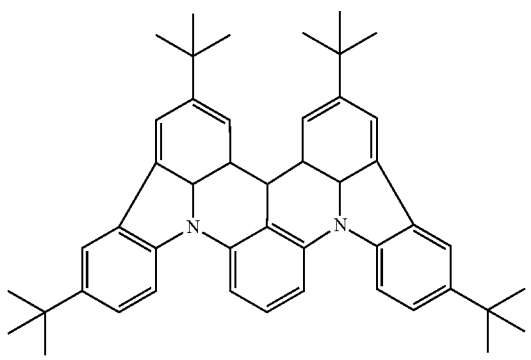

C-5

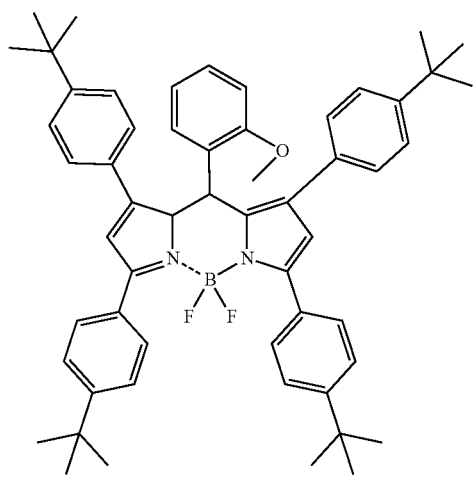

C-6

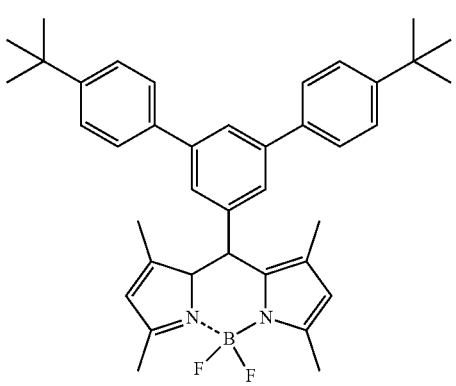

C-7

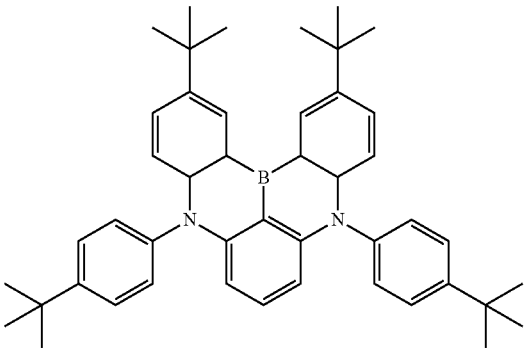

As shown in FIGS. 1 to 4, in some embodiments of the present disclosure, the light-emitting layer 500 includes a first light-emitting layer 510 and a second light-emitting layer 520, and the second light-emitting layer 520 is disposed on a side of the first light-emitting layer 510 away from the anode 100. The first light-emitting layer 510 includes the first host material, and the second light-emitting layer 520 includes the second host material. At least one of the first light-emitting layer 510 and the second light-emitting layer 520 includes the auxiliary material; and at least one of the first light-emitting layer 510 and the second light-emitting layer 520 include the dopant material.

In another embodiment of the present disclosure, the light-emitting layer 500 includes a first light-emitting layer 510 and a second light-emitting layer 520, and the second light-emitting layer 520 is disposed on the side of the first light-emitting layer 510 away from the anode 100. The first light-emitting layer 510 includes the first host material and the first auxiliary material, and the second light-emitting layer 520 includes the second host material and the second auxiliary material. At least one of the first light-emitting layer 510 and the second light-emitting layer 520 includes the dopant material.

The present disclosure also provides a display device including the aforementioned organic light-emitting device. The display device may be: a mobile phone, a tablet computer, a TV set, a monitor, a notebook computer, a digital photo frame or a navigator, or any other product or component with a display function.

The organic light-emitting device provided by the present disclosure will be described in detail below in combination with specific test data and the like.

Example 1

Figure 6:
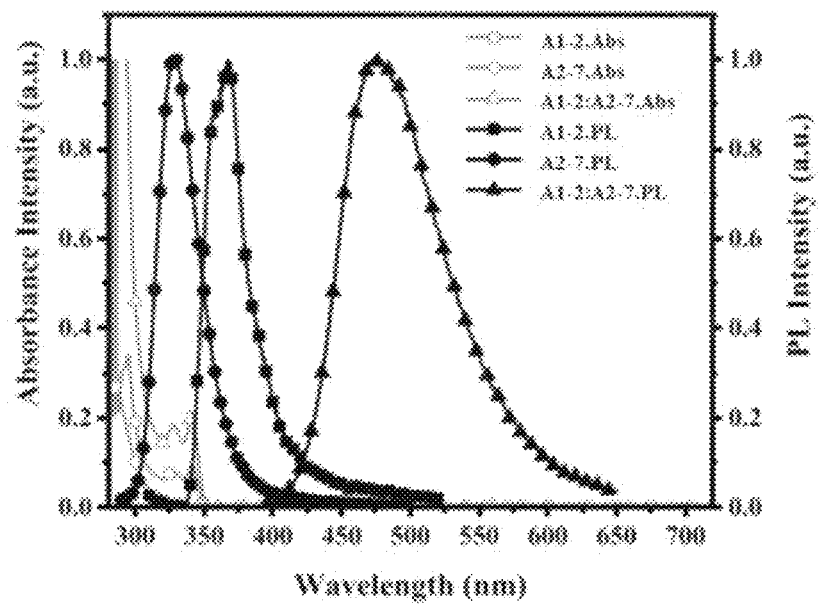
FIG. 6 is an absorption spectrum diagram of A1-2, A2-7 emission in an exemplary embodiment of the present disclosure.

Using the evaporation process, respectively evaporating a single-layer film of compound A1-2, a single-layer film of compound A2-7, and a mixed film of compound A1-2 and compound A2-7 at a molar ratio of 1:1. The absorption and emission spectrum is shown in FIG. 6, in FIG. 6, the emission spectrum of the mixed film appears red-shifted, which is obviously different from the spectrum of the single-layer film, indicating that compound A1-2 and compound A2-7 form the first composite transport material.

Example 2

Using the evaporation process, respectively evaporating a single-layer film of compound B-3 and a mixed film of compound B-3 and compound A2-7 at a molar ratio of 1:1.

Figure 7:
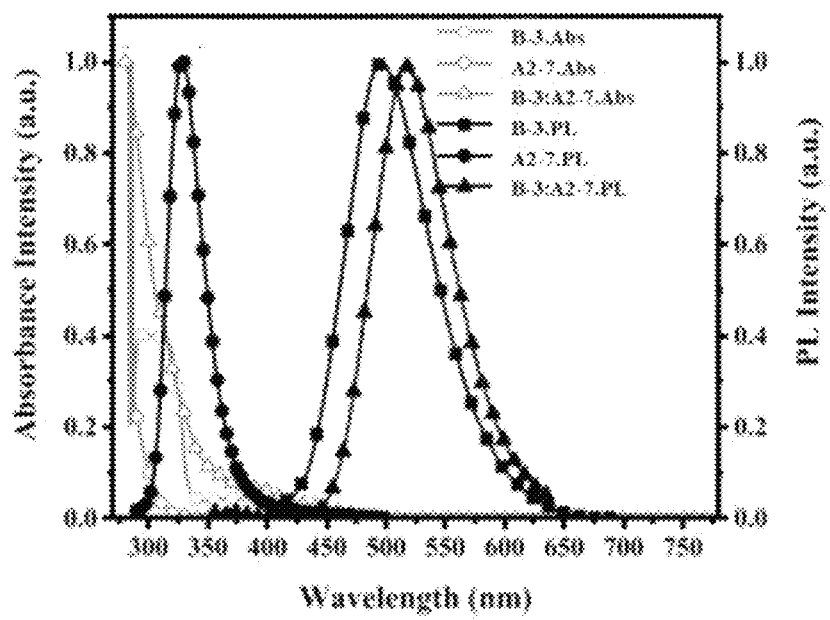
FIG. 7 is an absorption spectrum diagram of B-3, A2-7 emission in an exemplary embodiment of the present disclosure.

The absorption and emission spectrum are shown in FIG. 7. The emission spectrum of the mixed film appears red-shifted, indicating that compound B-3 and compound A2-7 form the second composite transport material.

Example 3

Figure 8:
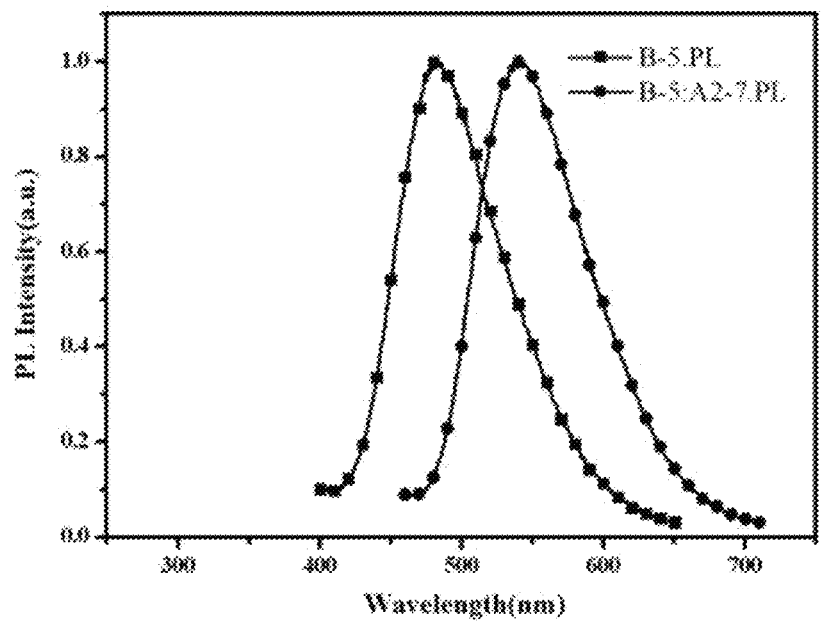
FIG. 8 is an absorption spectrum diagram of B-5, A2-7 emission in an exemplary embodiment of the present disclosure.

Using the evaporation process, respectively evaporating a single-layer film of compound B-5 and a mixed film of compound B-5 and compound A2-7 at a molar ratio of 1:1. The emission spectrum is shown in FIG. 8, which indicates that the compound B-5 and compound A2-7 can also form the second composite transport material.

The energy levels of the compounds A1-2, A2-7, B-3, B-5, and the formed composite transport materials in the above examples were tested respectively, and the results are shown in Table 1:

TABLE 1

| Material | HOMO (eV) | LUMO (eV) | S1 (eV) | T1 (eV) |
|---|---|---|---|---|
| A1-2 | 5.83 | 2.46 | 3.41 | 3.02 |
| A2-7 | 6.45 | 3.22 | 3.60 | 2.95 |
| B-3 | 5.65 | 3.10 | 2.52 | 2.51 |
| B-5 | 5.78 | 3.18 | 2.61 | 2.60 |
| A1-2:A2-7 |  |  | 2.69 | 2.67 |
| B-3:A2-7 |  |  | 2.44 | 2.41 |
| B-5:A2-7 |  |  | 2.35 | 2.32 |

In order to verify the performance of the organic light-emitting device provided in this application, the corresponding organic light-emitting device was prepared and its performance was tested.

Example 3

An anode is formed on a glass substrate. The anode may include an indium tin oxide film layer. The anode can be deposited and formed by vacuum evaporation. Then, a hole injection layer is formed by vapor deposition on the anode, a hole transport layer is formed on the hole injection layer, and a first exciton blocking layer is formed on the hole transport layer.

Subsequently, the first light-emitting layer is formed by co-evaporating A1-2: B-3 (70%:30%), and the second light-emitting layer is formed by co-evaporating A2-7:B-3:C-5 (64%:35%:1%).

Afterwards, the second exciton blocking layer, the electron transport layer, the electron injection layer and the cathode are sequentially evaporated, and the cathode may include silver.

Example 4

The first light-emitting layer is formed by co-evaporating A1-2:B-3 (70%:30%), and the second light-emitting layer is formed by co-evaporating A2-7:B-5:C-5 (59%:40%:1%), and the others are the same as in Example 3.

Comparative Example 1

Co-evaporating A1-2: B-3:C-5 (59%:40%:1%) to form a light-emitting layer, the others are the same as in Example 3.

Comparative Example 2

Co-evaporating A2-7:B-3:C-5 (59%:40%:1%) to form a light-emitting layer, and the others are the same as in Example 3.

Comparative Example 3

Co-evaporating A1-2:B-3 (70%:30%) to form the first light-emitting layer, and co-evaporating A1-2:B-5:C-5 (59%:40%:1%) to form the second light-emitting layer, others are the same as in Example 3.

The performance test structure of the organic light-emitting device prepared above is shown in Table 2:

TABLE 2

| Device | current density (mA/cm$^2$) | Voltage (V) | Efficiency (Cd/A) | λ peak(nm) | LT95 |
|---|---|---|---|---|---|
| Comparative example 1 | 15 | 100% | 100% | 620 | 100% |
| Comparative example 2 |  | 92.3% | 171.3% | 620 | 82% |
| Comparative example 3 |  | 96.2% | 114.6% | 620 | 105% |
| Example 3 |  | 92.0% | 195.8% | 620 | 108% |
| Example 4 |  | 94.1% | 180.1% | 620 | 112% |

In Table 2, based on Comparative Example 1, the voltage, efficiency and life are percentages of other Comparative Examples or Examples compared to the Comparative Example 1.

The example 3 and example 4, compared with comparative example 1 to comparative example 3, efficiency and life are all improved, and its reason may be because in example 3 and example 4, A1-2 and A2-7 form the first composite transport material, B-3 and A2-7 form the second composite transport material, and the formed composite transport material has the opportunity to form excitons and transfer the excitonic energy, which greatly suppresses the non-radiative transition of the triplet excitons, reduces the degradation of materials caused by triplet quenching, improves the stability of materials, and transfers energy to the next energy transmission channel through Forster, or transfers to dopant materials for radiative transition luminescence, reduces energy loss and improves device efficiency.

Compared with example 3, the life of example 4 is further improved, because the second sub-composite transport material formed by A2-7 and B-5 is additionally added, which leads to the dispersion of the overall exciton energy in the device, which alleviates the deterioration of the material to a certain extent.

It should be understood that the present disclosure is not limited in its application to the detailed construction and arrangement of components set forth in this specification. The disclosure is capable of other embodiments and of being practiced and carried out in various ways. The foregoing variations and modifications fall within the scope of the present disclosure. It shall be understood that the disclosure disclosed and defined in this specification extends to all alternative combinations of two or more of the individual features mentioned or evident in the text and/or drawings. All of these different combinations constitute alternative aspects of the disclosure. The embodiments described herein describe the best mode known for carrying out the disclosure and will enable others skilled in the art to utilize the disclosure.

What is claimed is:

1. An organic light-emitting device, comprising a light-emitting layer, the light-emitting layer comprising a first host material, a second host material, at least one auxiliary material, and at least one dopant material;
   wherein the first host material and the second host material form a first composite transport material; and the secondary material and the second host material form a second composite transport material;
   wherein the first host material, the second host material, the first composite transport material, the second composite transport material, and the dopant material satisfy,
   S1(A)>S1(CH)>S1(C); T1(A)>T1(CH)>T1(C);
   wherein S1(A) is a lowest singlet state energy of the first host material or the second host material, and S1(CH) is a lowest singlet state energy of the first composite transport material or the second composite transport material, and S1(C) is a lowest singlet state energy of the dopant material; and
   wherein T1(A) is a lowest triplet state energy of the first host material or the second host material, T1(CH) is a lowest triplet state energy of the first composite transport material or the second composite transport material, and T1(C) is a lowest triplet state energy of the dopant material.

2. The organic light-emitting device according to claim 1, wherein the first host material, the second host material, the first composite transport material, the second composite transport material and the auxiliary material satisfy,
   S1(A)>S1(CH1)>S1(CH2), S1(A)>S1(B)>S1(CH2); and
   T1(A)>T1(CH1)>T1(CH2), T1(A)>T1(B)>T1(CH2);
   wherein, S1(CH1) is a lowest singlet state energy of the first composite transport material; and S1(CH2) is a lowest singlet state energy of the second composite transport material;
   wherein S1(B) is a lowest singlet state energy of the auxiliary material; and T1(B) is a lowest triplet state energy of the auxiliary material; and
   wherein T1(CH1) is a lowest triplet state energy of the first composite transport material; and T1(CH2) is a lowest triplet state energy of the second composite transport material.

3. The organic light-emitting device according to claim 1, wherein the first host material, the second host material and the auxiliary material satisfy,
   |HOMO(A2)−LUMO(A1)|≥3.5 eV, |HOMO(A1)−LUMO(A2)|≤3 eV, and |HOMO(B)−LUMO(A2)|≥2.3 eV;
   wherein HOMO(A1) is a highest occupied molecular orbital HOMO energy level of the first host material, and LUMO(A1) is a lowest unoccupied molecular orbital LUMO energy level of the first host material;
   wherein HOMO(A2) is a highest occupied molecular orbital HOMO energy level of the second host material, and LUMO(A2) is a lowest unoccupied molecular orbital LUMO energy level of the second host material; and
   wherein HOMO (B) is a highest occupied molecular orbital HOMO energy level of the auxiliary material, and LUMO (B) is a lowest unoccupied molecular orbital LUMO energy level of the auxiliary material.

4. The organic light-emitting device according to claim 3, wherein the first host material, the second host material and the auxiliary material satisfy,
   |HOMO(A1)|>|HOMO(B)|≥5.6 eV; and
   |LUMO(B)|>|LUMO(A2)|≥1 eV.

5. The organic light-emitting device according to claim 1, wherein the first host material and the auxiliary material are hole-type materials, and the second host material is an electron-type material; and
   a hole mobility of the first host material is higher than a hole mobility of the auxiliary material.

6. The organic light-emitting device according to claim 5, wherein a difference between the hole mobility and the electron mobility of the auxiliary material is not more than two orders of magnitude.

7. The organic light-emitting device according to claim 1, wherein the first composite transport material and the second composite transport material satisfy,
   $\Delta E_{ST}$(CH)≤0.3 eV;
   wherein, $\Delta E_{ST}$(CH) is an energy level difference between the lowest singlet state energy of the first composite transport material and the lowest triplet state energy of the first composite transport material, or is an energy level difference between lowest singlet state energy of the second composite transport material and the lowest triplet state energy of the second composite transport material.

8. The organic light-emitting device according to claim 1, wherein the auxiliary material is a delayed fluorescence material, and the auxiliary material satisfies,
   $\Delta E_{ST}$(B)≤0.3 eV;
   wherein, $\Delta E_{ST}$(B) is an energy level difference between the lowest singlet state energy of the auxiliary material and the lowest triplet state energy of the auxiliary material.

9. The organic light-emitting device according to claim 1, wherein an emission spectrum of the second composite transport material is overlapped with an absorption spectrum of the dopant material, and a ratio between an overlapped area and an area of the emission spectrum of the second composite transport material is a, wherein a≥30%; and
   an emission spectrum of the auxiliary material is overlapped with an absorption spectrum of the dopant material, and a ratio between an overlapped area and an area of the emission spectrum of the auxiliary material is b, wherein b≥30%.

10. The organic light-emitting device according to claim 1, wherein the at least one auxiliary material comprises a first auxiliary material and a second auxiliary material;
    the second composite transport material comprises a first sub-composite transport material and a second sub-composite transport material;
    the first auxiliary material and the second host material form the first sub-composite transport material, the second auxiliary material and the second host material form the second sub-composite transport material; and
    the second auxiliary material and the second sub-composite transport material satisfy,
    S1(B2)>S1(CH22); and
    T1(B2)>T1(CH22);
    wherein, S1(B2) is a lowest singlet state energy of the second auxiliary material; and T1(B2) is a lowest triplet state energy of the second auxiliary material; and
    wherein S1(CH22) is a lowest singlet state energy of the second sub-composite transport material; and T1(CH22) is a lowest triplet state energy of the second sub-composite transport material.

11. The organic light-emitting device according to claim 10, wherein the first composite transport material, the first auxiliary material, the second auxiliary material, the first sub-composite transport material and the second sub-composite transport material satisfy, S1(CH1)>S1(B2)>S1(B1)>S1(CH21)>S1(CH22); and
T1(CH1)>T1(B2)>T1(B1)>T1(CH21)>T1(CH22);

wherein, S1(CH1) is a lowest singlet state energy of the first composite transport material; and S1(CH2) is a lowest singlet state energy of the second composite transport material;

wherein S1(B1) is a lowest singlet state energy of the second auxiliary material; and T1(B1) is a lowest triplet state energy of the second auxiliary material; and wherein S1(CH21) is a lowest singlet state energy of the first sub-composite transport material; T1(CH21) is the lowest triplet state energy of the first sub-composite transport material.

12. The organic light-emitting device according to claim 10, wherein the first auxiliary material and the second auxiliary material satisfy,

|HOMO(B2)|−|HOMO(B1)|≤0.5 eV;

wherein, HOMO(B1) is a highest occupied molecular orbital HOMO energy level of the first auxiliary material, and HOMO(B2) is a highest occupied molecular orbital HOMO energy level of the second auxiliary material.

13. The organic light-emitting device according to claim 1, wherein the dopant material is selected from fluorescent materials containing boron and nitrogen.

14. The organic light-emitting device according to claim 1, wherein the first host material is selected from a hole-type material containing one or more groups of a carbazole group, a spirofluorene group, a biphenyl group, and an acridine group.

15. The organic light-emitting device according to claim 1, wherein the second host material is selected from an electron-type material containing one or more groups of a cyano group, a pyridine group, a pyrimidine group, a triazine group, and a phosphooxy group.

16. The organic light-emitting device according to claim 5, wherein the auxiliary material is selected from a material containing an electron-donating group and an electron-withdrawing group, and the electron-donating group is selected from one or more of a carbazole group, a phenoxazine group, an acridine group, a fluorene group, a dibenzothiophene group, and a dibenzofuran group, and the electron-withdrawing group is selected from one or more of a cyano group, a triazine group, and a phosphooxy group.

17. The organic light-emitting device according to claim 1, wherein the organic light-emitting device further comprises a cathode and an anode, and the light-emitting layer is disposed between the anode and the cathode;

wherein the light-emitting layer comprises a first light-emitting layer and a second light-emitting layer, and the second light-emitting layer is disposed on a side of the first light-emitting layer away from the anode;

the first light-emitting layer comprises the first host material, and the second light-emitting layer comprises the second host material;

at least one of the first light-emitting layer and the second light-emitting layer comprises the auxiliary material; and at least one of the first light-emitting layer and the second light-emitting layer comprises the dopant material.

18. The organic light-emitting device according to claim 10, wherein the organic light-emitting device further comprises a cathode and an anode, and the light-emitting layer is disposed between the anode and the cathode;

wherein the light-emitting layer comprises a first light-emitting layer and a second light-emitting layer, and the second light-emitting layer is disposed on a side of the first light-emitting layer away from the anode;

the first light-emitting layer comprises the first host material and the first auxiliary material, and the second light-emitting layer comprises the second host material and the second auxiliary material; and at least one of the first light-emitting layer and the second light-emitting layer comprises the dopant material.

19. A display device comprising an organic light-emitting device, wherein the organic light-emitting device comprises:

a light-emitting layer, the light-emitting layer comprising a first host material, a second host material, at least one auxiliary material, and at least one dopant material;

wherein the first host material and the second host material form a first composite transport material; and the secondary material and the second host material form a second composite transport material;

wherein the first host material, the second host material, the first composite transport material, the second composite transport material, and the dopant material satisfy,

S1(A)>S1(CH)>S1(C); T1(A)>T1(CH)>T1(C);

wherein S1(A) is a lowest singlet state energy of the first host material or the second host material, and S1(CH) is a lowest singlet state energy of the first composite transport material or the second composite transport material, and S1(C) is a lowest singlet state energy of the dopant material; and wherein T1(A) is a lowest triplet state energy of the first host material or the second host material, T1(CH) is a lowest triplet state energy of the first composite transport material or the second composite transport material, and T1(C) is a lowest triplet state energy of the dopant material.

20. The display device according to claim 19, wherein the first host material, the second host material, the first composite transport material, the second composite transport material and the auxiliary material satisfy, S1(A)>S1(CH1)>S1(CH2), S1(A)>S1(B)>S1(CH2); and
T1(A)>T1(CH1)>T1(CH2), T1(A)>T1(B)>T1(CH2);

wherein, S1(CH1) is a lowest singlet state energy of the first composite transport material; and S1(CH2) is a lowest singlet state energy of the second composite transport material;

wherein S1(B) is a lowest singlet state energy of the auxiliary material; and T1(B) is a lowest triplet state energy of the auxiliary material; and wherein T1(CH1) is a lowest triplet state energy of the first composite transport material; and T1(CH2) is a lowest triplet state energy of the second composite transport material.

* * * * *